United States Patent
Miyashita et al.

(10) Patent No.: US 7,327,201 B2
(45) Date of Patent: Feb. 5, 2008

(54) SEMICONDUCTOR INTEGRATED CIRCUIT DEVICE AND WIRELESS COMMUNICATION DEVICE

(75) Inventors: Daisuke Miyashita, Kanagawa-ken (JP); Hiroki Ishikuro, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 11/300,367

(22) Filed: Dec. 15, 2005

(65) Prior Publication Data

US 2006/0152295 A1   Jul. 13, 2006

(30) Foreign Application Priority Data

Dec. 17, 2004   (JP)   ............................. 2004-365787

(51) Int. Cl.
*H03B 5/00*   (2006.01)
(52) U.S. Cl. ............................... 331/185; 331/117 FE; 331/117 R; 331/167; 331/175
(58) Field of Classification Search ................ 331/175, 331/185, 117 FE, 167, 117 R
See application file for complete search history.

(56) References Cited

U.S. PATENT DOCUMENTS

| | | | |
|---|---|---|---|
| 5,834,983 A | 11/1998 | Higgins, Jr. | |
| 6,653,908 B1 | 11/2003 | Jones | ......................... 331/183 |
| 6,700,450 B2 | 3/2004 | Rogers | ................... 331/117 R |
| 7,061,337 B2 * | 6/2006 | Partovi et al. | .............. 331/109 |

FOREIGN PATENT DOCUMENTS

EP   0 978 945 A1   2/2000

OTHER PUBLICATIONS

Axel D. Berny, et al. "A 1.8 GHz LC VCO with 1.3 GHz Tuning Range and Mixed-signal Amplitude Calibration", 2004 Symposium On VLSI Circuits Digest of Technical Papers, XP-002371693, Jun. 19, 2004, pp. 54-57.
Daisuke Miyashita, et al., "A Phase Noise Minimization of CMOS VCOs over Wide Tuning Range and Large PVT Variations", Proceedings of the IEEE, 2005 Custom Integrated Circuits Conference, XP-010873594, Sep. 18, 2005, pp. 583-586.

* cited by examiner

*Primary Examiner*—Arnold Kinkead
(74) *Attorney, Agent, or Firm*—Oblon, Spivak, McClelland, Maier & Neustadt, P.C.

(57) ABSTRACT

A semiconductor integrated circuit device having a voltage controlled oscillation circuit that is capable of sufficient oscillation performance and a wireless communication device having the semiconductor integrated circuit device are disclosed. A difference between the maximum value and the minimum value of the oscillation output signal is automatically controlled to be substantially equal to the first predetermined voltage which is the threshold voltage of the oscillation MOSFET for sufficient phase noise performance. It is further disclosed that the difference between the maximum value and the minimum value of the oscillation output signal may be varied by the change of the threshold voltage of the MOSFET caused by substrate bias effect, while maintaining the sufficient phase noise performance.

31 Claims, 10 Drawing Sheets

SEMICONDUCTOR INTEGRATED CIRCUIT DEVICE AND WIRELESS COMMUNICATION DEVICE

CROSS REFERENCE TO RELATED APPLICATION

This application is based upon and claims the benefit of priority from the prior Japanese Patent Application No. 2004-365787, filed on Dec. 17, 2004, the entire contents of which are incorporated herein by reference.

FIELD OF THE INVENTION

The present invention relates to a semiconductor integrated circuit device and a wireless communication device, which is capable of sufficient oscillation performance.

DESCRIPTION OF THE BACKGROUND

A wireless communication device such as a mobile phone which is provided with a voltage controlled oscillation circuit is widely used. The oscillation frequency of the voltage controlled oscillation circuit may be varied by a control voltage.

In a conventional voltage controlled oscillation circuit, there is a problem that phase noise performance deteriorates by a noise when the amplitude of the oscillation output signal is too small. There is also a problem that the phase noise performance deteriorates by a distortion of the oscillation output signal when the amplitude of the oscillation output signal is too large.

In the case that the voltage controlled oscillation circuit is provided with a metal-oxide semiconductor field effect transistor (hereinafter, referred to as "MOSFET"), the phase noise performance deteriorates because distortion occurs in the oscillation output signal, when the MOSFET operates within a linear operation area, i.e. when the amplitude of the oscillation output signal is larger than a threshold voltage of the MOSFET.

The amplitude of the oscillation output signal may be adjusted by regulating a bias current of the voltage control oscillation circuit so as to be substantially equal to the threshold voltage of the MOSFET.

However, it causes a problem that the phase noise performance fluctuates because the amplitude of the oscillation output signal fluctuates by the changes of an operation condition such as bias current or threshold voltage of the MOSFET.

The changes of the operation condition occur by the influence of use environment such as operation temperature or power supply voltage, and of oscillation frequency.

Even if the amplitude of the oscillation output signal is fixed to a value, there is still a problem that the phase noise performance fluctuates because the threshold voltage of the MOSFET changes in the fabrication process.

A voltage controlled oscillation circuit which suppresses the phase noise is proposed in U.S. Pat. No. 5,834,983.

This voltage controlled oscillation circuit fixes the amplitude of the oscillation output signal to a reference signal which shows a maximum level immediately before the distortion begins to occur in the oscillation output signal.

This voltage controlled oscillation circuit comprises a constant collector bias current source, a variable collector bias voltage circuit and a voltage tunable resonant circuit.

The variable collector bias voltage circuit detects the collector output amplitude of a transistor of the variable collector bias voltage circuit. The variable collector bias voltage circuit regulates the collector bias voltage using the integration value of the difference between the collector bias voltage and the reference signal. By the regulation, the variable collector bias voltage circuit controls the amplitude of the oscillation output signal so as to become constant.

The operation point of the transistor is kept at a constant relation to an emitter cut-off, because a collector bias current is kept constant by the constant collector bias current source.

The collector voltage is high sufficiently in accordance with the initial setting values of the constant collector bias current corresponding to each resonated voltage, and with the reference signal. Consequently, the collector bias current is controlled to a state that the moment collector current is substantially zero, i.e. to a state immediately before emitter cut-off.

The voltage controlled oscillation circuit described above causes a problem that a sufficient phase noise performance is not obtained depending on the variation in the transistor fabrication process.

It is because the amplitude of the oscillation output signal is controlled to keep a prediction value. The prediction value is not the amplitude of the oscillation output signal but a bias voltage, which is predicted to minimize the phase noise by detecting a maximum or a minimum value of the oscillation output signal.

Another voltage controlled oscillation circuit is proposed in U.S. Pat. No. 6,653,908. In the voltage controlled oscillation circuit, the amplitude of the oscillation output signal is automatically controlled so that the phase noise may be minimized.

This voltage controlled oscillation circuit comprises an oscillation circuit having a bipolar transistor, a negative peak detector to detect a minimum value of the collector voltage of the transistor, and a positive peak detector to detect a maximum value of the emitter voltage of the transistor.

The bias current of the voltage controlled oscillation circuit is controlled by a feedback of the bias current so that the difference between the minimum value of the collector voltage and the maximum value of the emitter voltage is substantially equal to a saturation voltage of the bipolar transistor.

In the voltage controlled oscillation circuit of U.S. Pat. No. 6,653,908 described above, it is indefinite how saturation voltage is produced. Further, any circuit structure, which utilizes a MOSFET for the transistor is not disclosed.

SUMMARY OF THE INVENTION

According to an aspect of the invention is to provide a semiconductor integrated circuit device comprising a voltage controlled oscillation circuit, a maximum value detection circuit to detect a maximum value of an oscillation output signal of the voltage controlled oscillation circuit, a minimum value detection circuit to detect a minimum value of the oscillation output signal of the voltage controlled oscillation circuit, a first reference voltage generation circuit to output a first predetermined voltage, a bias current control circuit to regulate a bias current of the voltage controlled oscillation circuit by a control signal, the bias current control circuit being connected in series to the voltage controlled oscillation circuit and a differential amplifier to output a feedback signal to the bias current control circuit so that the difference between the maximum value and the minimum value of the oscillation output signal may be substantially equal to the first predetermined voltage.

According to another aspect of the invention is to provide a semiconductor integrated circuit device comprising a voltage controlled oscillation circuit, a maximum value detection circuit to detect a maximum value of an oscillation output signal of the voltage controlled oscillation circuit, a minimum value detection circuit to detect a minimum value of the oscillation output signal of the voltage controlled oscillation circuit, a first reference voltage generation circuit to output a first predetermined voltage, a current control circuit to regulate a bias current of the voltage controlled oscillation circuit by a control signal, the bias current control circuit being connected in series to the voltage controlled oscillation circuit, a comparator to compare the difference between the maximum value and the minimum value of the oscillation output signal with the first predetermined voltage to output a result of the comparison and a bias current sweep circuit to sweep the bias current based on the result of the comparison of the comparator so that the difference between the maximum value and the minimum value of the oscillation output signal may be substantially equal to the first predetermined voltage.

DETAILED DESCRIPTION OF THE INVENTION

Figure 1:
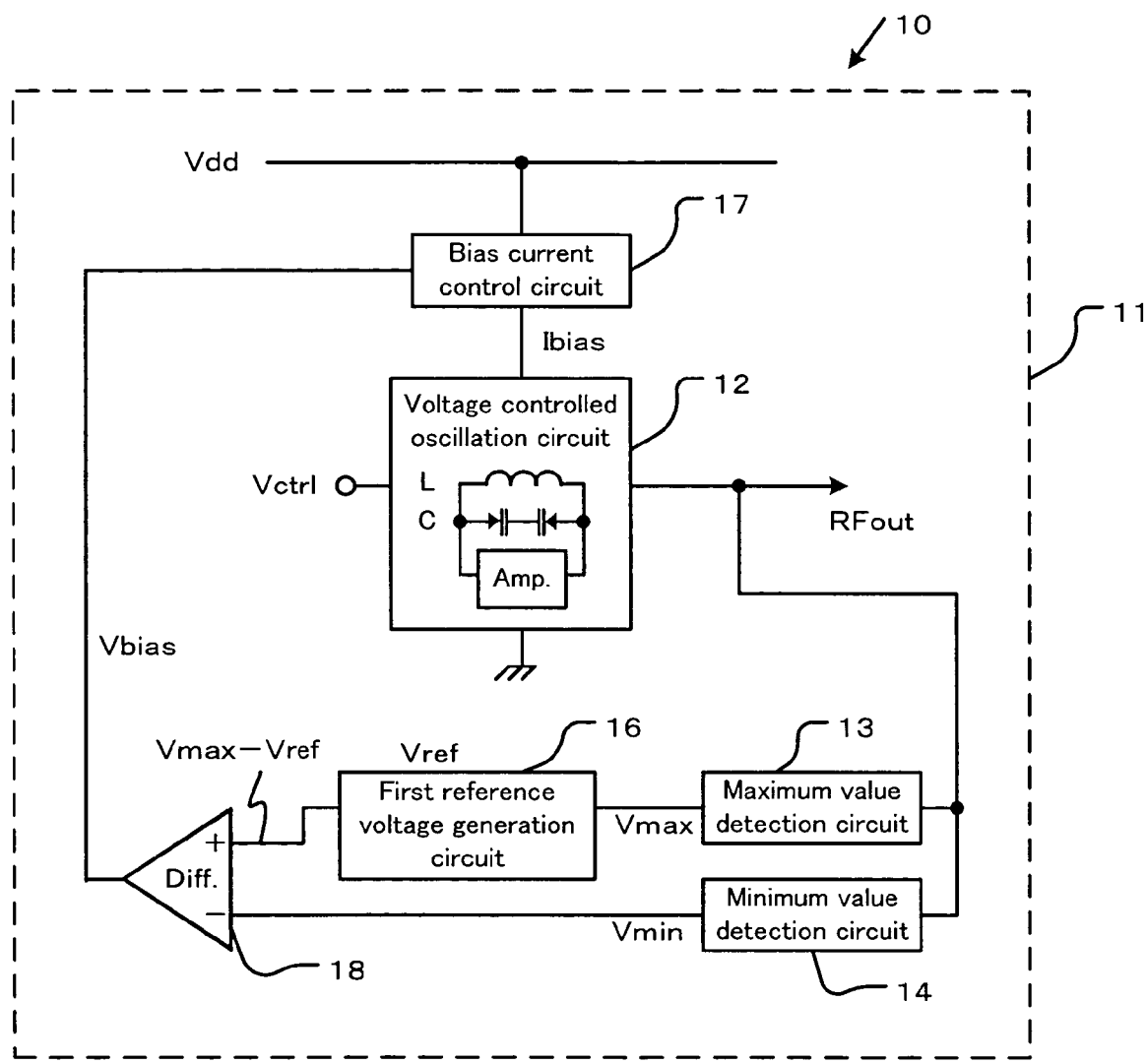
FIG. 1 shows a schematic block diagram of a semiconductor integrated circuit device according to a first embodiment of the present invention.
Figure 2:
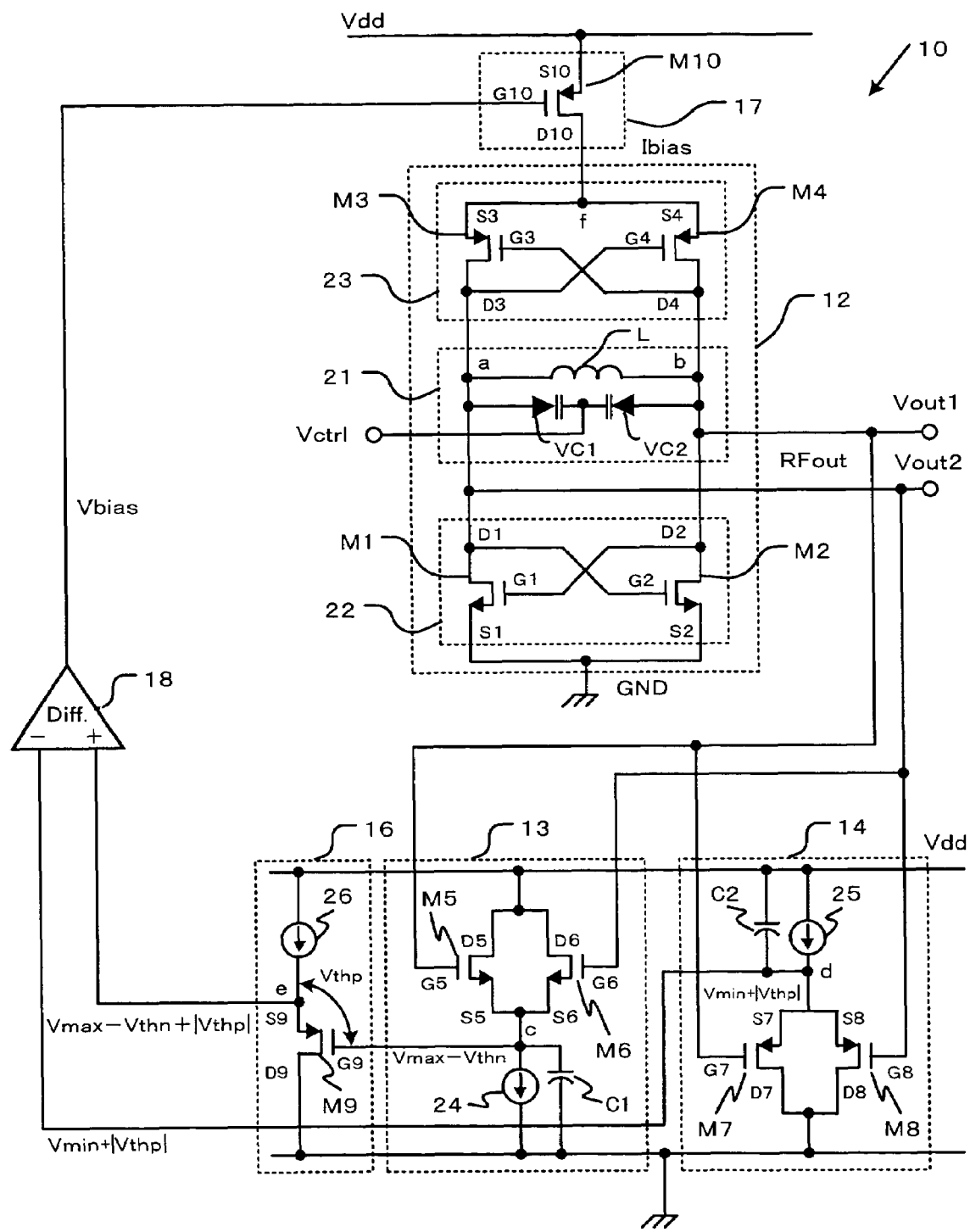
FIG. 2 shows a schematic circuitry of the semiconductor integrated circuit device of FIG. 1.

Embodiments of the present invention will be described below in detail with reference to the drawings. With reference to FIGS. 1 and 2, a semiconductor integrated circuit device of a first embodiment according to the invention is hereinafter explained. FIG. 1 shows a schematic block diagram of the semiconductor integrated circuit device. FIG. 2 shows a schematic circuitry of the semiconductor integrated circuit device according to the first embodiment of the invention.

As shown in FIG. 1, a semiconductor integrated circuit device 10 is formed on a silicon substrate 11 and is provided with a voltage controlled oscillation circuit 12 having a coil, variable capacitance diodes and a amplification circuit, a maximum value detection circuit 13 to detect a maximum value of the oscillation output signal of the voltage controlled oscillation circuit 12 and a minimum value detection circuit 14 to detect a minimum value of the oscillation output signal of the voltage controlled oscillation circuit 12. The coil and the variable capacitance diodes constitute a resonant circuit.

The semiconductor integrated circuit device 10 has a first reference voltage generation circuit 16 to output a first predetermined voltage. The semiconductor integrated circuit device 10 is provided with a bias current control circuit 17 to regulate a bias current Ibias of the voltage controlled oscillation circuit 12 by a control voltage Vbias. The bias current control circuit 17 is connected in series to the voltage controlled oscillation circuit 12. The semiconductor integrated circuit device 10 has a differential amplifier 18 having two input terminals and an output terminal. One of the input terminals is connected to an output terminal of the maximum value detection circuit 13 via the first reference voltage generation circuit 16. The other of the input terminals is connected to an output terminal of the minimum value detection circuit 14. The output terminal is connected to a control terminal of the bias current control circuit 17.

When the bias current Ibias begins to flow, the voltage controlled oscillation circuit 12 oscillates and outputs the oscillation output signal RFout. The oscillation frequency is substantially determined by a parallel resonant frequency of the resonant circuit having the coil and the variable capacitance diodes. The oscillation is caused by the positive feedback of the amplification circuit.

The maximum value detection circuit 13 outputs a value being proportional to the maximum value of the oscillation output signal RFout.

The minimum value detection circuit 14 outputs a value being proportional to the minimum value of the oscillation output signal RFout. The first reference voltage generation circuit 16 generates a first predetermined voltage Vref. The first reference voltage generation circuit 16 outputs a level shifted voltage Vmax−Vref, when an output voltage Vmax of the maximum value detection circuit 13 is provided.

The differential amplifier 18 outputs the control voltage Vbias to the bias current control circuit 17, when the level shifted voltage Vmax−Vref is provided to one of the input terminals, and when an output voltage Vmin of the minimum value detection circuit 14 is provided to the other of the input terminals.

When the control voltage Vbias is provided, The bias current control circuit 17 regulates the bias current Ibias of the voltage controlled oscillation circuit 12 so that the bias current Ibias may be proportional to the control voltage Vbias. The oscillation output signal RFout of the voltage controlled oscillation circuit 12 is controlled by the bias current Ibias.

The differential amplifier 18 operates so that the voltage of one of the input terminals may be substantially equal to the voltage of the other of the input terminals. The difference between the maximum value and the minimum value Vmax−Vmin of the oscillation output signal RFout is controlled to be substantially equal to the first predetermined voltage Vref of the first reference voltage generation circuit 16.

The sufficient phase noise performance of the oscillation output signal RFout is obtained, because the first predetermined voltage Vref is determined to the threshold voltage of the MOSFET of the amplification circuit of the voltage controlled oscillation circuit 12. As a result, it will be possible that the sufficient phase noise performance of the oscillation output signal RFout is maintained, even if the threshold voltage of the MOSFET changes by the use environment and by the MOSFET fabrication process fluctuation.

As shown in FIG. 2, the voltage controlled oscillation circuit 12 is provided with a resonant circuit 21. The resonant circuit 21 is provided with a coil L having terminals a and b. and a series connected circuit of two variable capacitance diodes VC1, VC2 are connected in parallel. The voltage controlled oscillation circuit 12 has a first amplification circuit 22 coupled between the resonant circuit 21 and a ground GND. the voltage controlled oscillation circuit 12 further has a second amplification circuit 23 coupled between resonant circuit 21. The bias current control circuit 17 is connected to a power supply voltage Vdd.

The first amplification circuit 22 has first and second negative conductive type MOSFETs M1, M2 (hereinafter, referred to as "N-type MOSFET") having a drain, a source and a gate. The drain D1 of the first MOSFET M1 is connected to the gate G2 of the second MOSFET M2 and to terminal a of the coil L. The drain D2 of the second MOSFET M2 is connected to the gate G1 of the first MOSFET M1 and to the other terminals b of the coil L. The source S1 of the first MOSFET M1 and the source S2 of the second MOSFET M2 are connected to the ground respectively.

The second amplification circuit 23 has third and fourth positive conductive type MOSFETs M3, M4 (hereinafter, referred to as "P-type MOSFET") having a drain, a source and a gate. The drain D3 of The third MOSFET M3 is connected to the gate G4 of the fourth MOSFET M4 and to one of the terminals a of the coil L. The drain D4 of the fourth MOSFET M4 is connected to the gate G3 of the third MOSFET M3 and to the other of the terminals b of the coil L. The source S3 of the third MOSFET M3 and the source S4 of the fourth MOSFET M4 are connected to the bias current control circuit 17 respectively.

When the bias current Ibias of the voltage controlled oscillation circuit 12 begins to flow, the voltage controlled oscillation circuit 12 oscillates at a parallel resonant frequency of the resonant circuit 21 and outputs the oscillation output signal RFout from the output terminals Vout1, Vout2 connected to the terminals a and b of the coil L respectively. The oscillation frequency of the voltage controlled oscillation circuit 12 can be varied by the frequency control voltage Vctrl.

The maximum value detection circuit 13 is provided with fifth and sixth N-type MOSFETs M5, M6. A gate G5 of the fifth MOSFET M5 is connected to the first output terminal Vout1, and a gate G6 of the sixth MOSFET M6 is connected to the second output terminal Vout2. A drain D5 of the fifth MOSFET M5 and a drain D6 of the sixth MOSFET M6 are commonly connected to the power supply Vdd. A source S5 of the fifth MOSFET M5 and a source S6 of the sixth MOSFET M6 are connected to the ground via a parallel-connected circuit of a first constant current source 24 and a first capacitance C1.

Then, the threshold voltages of the first, second, fifth and sixth MOSFETs M1, M2, M5 and M6 are equal to each other.

A voltage of terminal c is maintained to the maximum value of the oscillation output signal RFout by the rectification effect of the fifth MOSFET M5, the sixth MOSFET M6 and the first capacitance C1.

A voltage Vgs between a gate G5 and source S5 of the fifth MOSFET M5 is substantially equal to the threshold voltage of the fifth and sixth MOSFETs M5 and M6, because the fifth and sixth MOSFETs M5, M6 are driven by the starting current of operation flowing from the first constant current source 24.

As a result, the subtract voltage Vmax−Vthn of the maximum value Vmax of the oscillation output signal RFout and the threshold voltage Vthn of the fifth and sixth MOSFETs M5,M6 will be obtained at a connection point c between the sources S5, S6 of the fifth and sixth MOSFETs M5,M6 and the first constant current source 24.

The minimum value detection circuit 14 comprises a seventh and eighth P-type MOSFETs M7, M8.

A gate G7 of the seventh MOSFET M7 is connected to the first output terminal Vout1 and a gate G8 of the eighth MOSFET M8 is connected to the second output terminal Vout2.

A source S7 of the seventh MOSFET M7 and a source S8 of the eighth MOSFET M8 are connected to the power supply Vdd via the parallel-connected circuit of the second constant current source 25 and the second capacitance C2.

A drain D7 of the seventh MOSFET M7 and a drain D8 of the eighth MOSFET M8 are connected to the ground in common.

As a result, the additional voltage Vmin+|Vthp| of the minimum value Vmin of the oscillation output signal RFout and the threshold voltage |Vthp| of the seventh and eight MOSFETs M7, M8 will be obtained at a node d between the sources S7, S8 of the seventh and eight MOSFETs M7, M8 and the second constant current source 25.

The first reference voltage generation circuit 16 is provided with a ninth P-type MOSFET M9. A gate G9 of the ninth MOSFET M9 is connected to a node c between the sources S5, S6 of the fifth and sixth MOSFETs M5, M6 and the first constant current source 24. A drain D9 of the ninth MOSFET M9 is connected to the ground.

A voltage Vgs between a gate G9 and a source S9 is substantially equal to the threshold voltage of the ninth MOSFET M9, when the ninth MOSFET M9 is driven by a starting operation current flowing from the third constant current source 26.

As a result, the shifted voltage Vmax−Vthn+|Vthp| by the threshold voltage |Vthp| of the ninth MOSFET M9 will be obtained at a node e between the drain D9 of the MOSFET M9 and the third constant current source 26, when the voltage Vmax−Vthn is applied to the gate G9 of the ninth MOSFET M9.

Then, the threshold voltages |Vthp| of the seventh, eight and ninth P-type MOSFETs M7, M8 and M9 are same.

The one of the input terminals of the differential amplifier 18 is connected to the node e between the source S9 and the third constant current source 26. The other of the input terminals of the differential amplifier 18 is connected to the node d between the sources S7, S8 of the seventh and eighth MOSFETs M7, M8 and the second constant current source 25.

The differential amplifier 18 outputs the control voltage Vbias to the current control circuit 17, when the voltage Vmax−Vthn+|Vthp| is applied to one of the input terminals and when the voltage Vmax+|Vthp| is applied to the other of the input terminals. The control voltage Vbias is proportional to the difference between the voltage Vmax−Vthn+|Vthp| and the voltage Vmax+|Vthp|.

The current control circuit 17 has a tenth P-type MOSFET M10. A gate G10 of the tenth MOSFET M10 is connected to the output terminal of the differential amplifier 18, a source S10 of the tenth MOSFET M10 is connected to the Power supply Vdd, and a drain D10 of the tenth MOSFET M10 is connected to the sources S3, S4 of the third and fourth MOSFETs M3, M4 of the second amplification circuit 23.

When the control voltage Vbias is applied to the gate G10 of the tenth MOSFET M10, the bias current Ibias of the voltage controlled oscillation circuit 12 is changed. Then, the control voltage Vbias controls the oscillation output signal RFout.

The difference between the maximum value and the minimum value Vmax−Vmin of the oscillation output signal RFout is controlled by feedback so as to be substantially equal to the threshold voltage Vthn of the N-type MOSFET. It is because the differential amplifier 18 operates so that the voltage Vmax−Vthn+|Vthp| of one of the input terminals is substantially equal to the voltage Vmin+|Vthp| of the other of the input terminals.

As a result, the difference between the maximum value and the minimum value Vmax−Vmin of the oscillation output signal RFout is always kept at a threshold voltage Vthn that gives a good phase noise performance. It is possible that the fluctuation of the phase noise performance is suppressed even if the use environment and the fabrication process cause the change of the threshold voltage Vthn of the MOSFET.

Figure 3A:
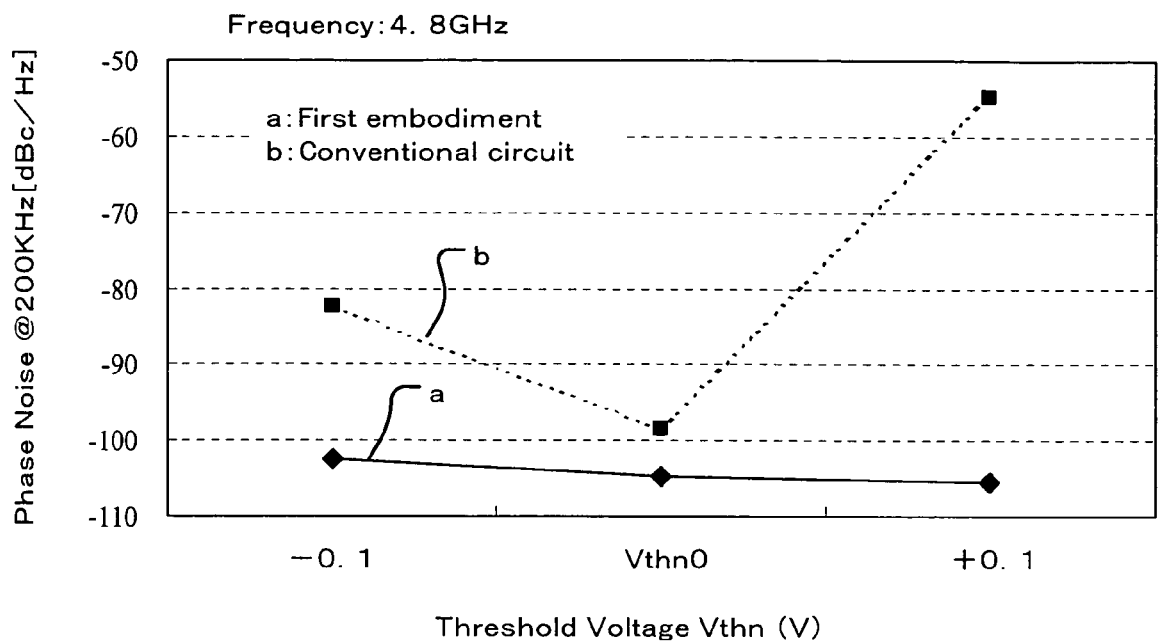
FIGS. 3A to 3B are plots showing a result of a simulation of the phase noise performance versus threshold voltage of a first conductive type MOSFET of the semiconductor integrated circuit device.
Figure 3B:
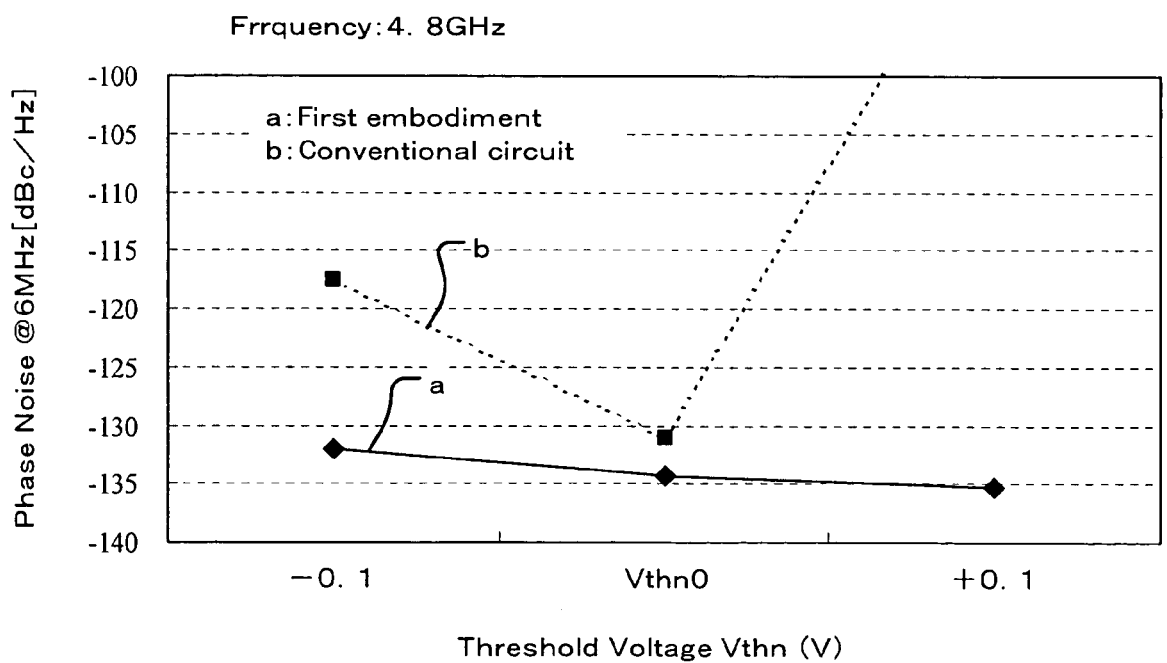

FIG. 3A shows a result of a simulation of the phase noise performance versus the threshold voltage of the N-type MOSFET at 200 kHz offset from a 4.8 GHz carrier. FIG. 3B shows a result of a simulation of the phase noise performance versus the threshold voltage of the N-type MOSFET at 6 MHz offset from a 4.8 GHz carrier.

The solid line a shows a result of a simulation according to the first embodiment. The broken line b shows a result of a simulation according to a conventional circuit, where a voltage controlled oscillation circuit is not provided with the maximum value detection circuit 13, the minimum value detection circuit 14, the first reference voltage generation circuit 16, the bias current control circuit 17 and the differential amplifier 18.

In the first embodiment, the phase noise performance are constant approximately with −105 dBc/Hz at 200 kHz offset from a 4.8 GHz carrier and −135 dBc/Hz at 6 GHz offset from a 4.8 GHz carrier respectively even though the threshold voltage of the MOSFET changes. While in the conventional circuit, the phase noise performance drastically deteriorated by the threshold voltage deviation ±0.1V from the designed value as for the standard threshold voltage.

In the first embodiment, the bias current Ibias changes so that the difference between the maximum value and the minimum value Vmax−Vmin of the oscillation output signal RFout traces the threshold voltage Vthn though the threshold voltage Vthn changes by the fluctuation of the fabrication process.

In the conventional circuit, the bias current Ibias is adjusted so that the difference between the maximum value and the minimum value Vmax−Vmin of the oscillation output signal RFout is equal to the predetermined threshold voltage. Then the difference between the maximum value and the minimum value Vmax−Vmin of the oscillation output signal RFout may be out of the range of the condition that gives a good phase noise performance by the fluctuation of the fabrication process.

Figure 4A:
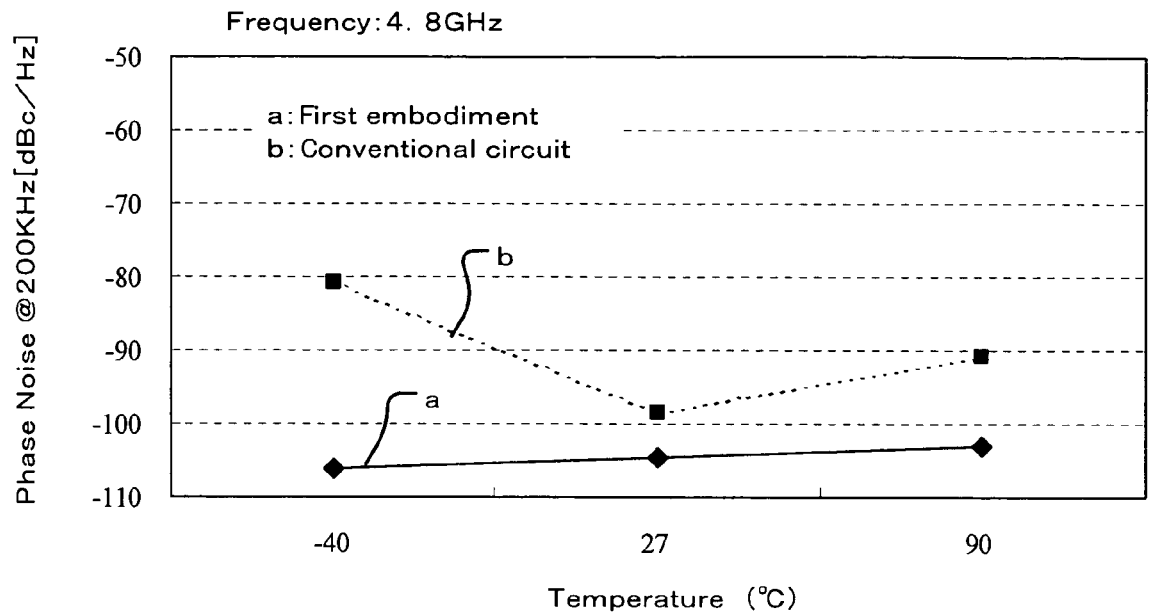
FIGS. 4A to 4B are plots showing a result of a simulation of the phase noise performance versus operation temperature.
Figure 4B:
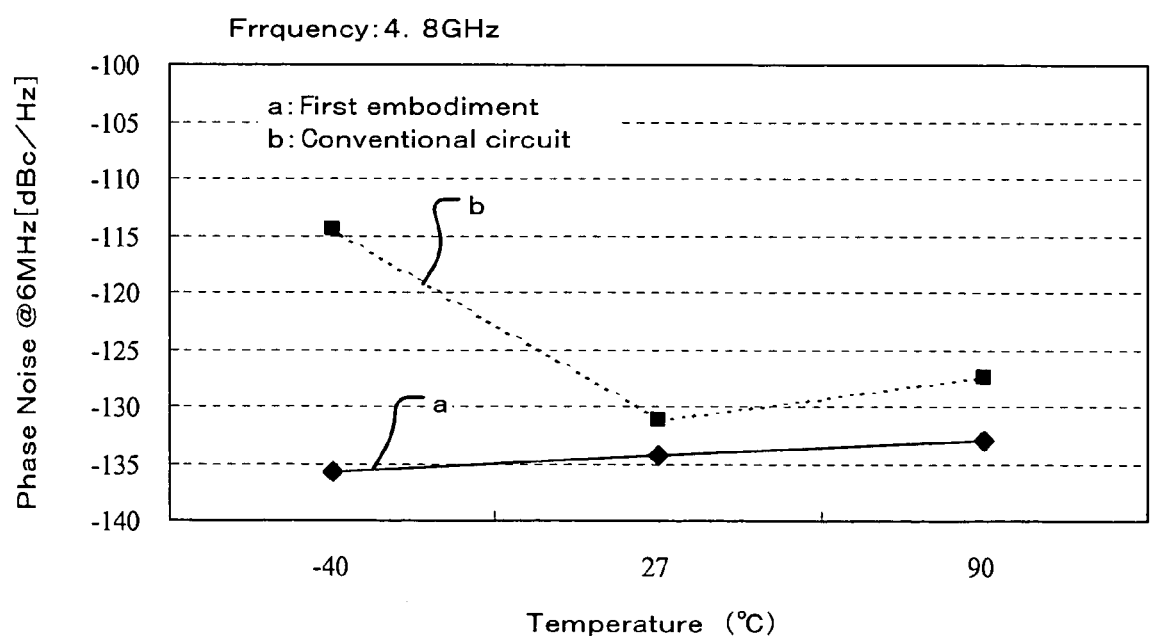

FIG. 4A shows a result of a simulation of the phase noise performance versus operation temperature at 200 kHz offset from a 4.8 GHz carrier. FIG. 4B shows a result of a simulation of the phase noise performance versus operation temperature at 6 MHz offset from a 4.8 GHz carrier.

In the first embodiment, the phase noise performance are constant approximately with −105 dBc/Hz at 200 kHz offset from a 4.8 GHz carrier and −135 dBc/Hz at 6 GHz offset from a 4.8 GHz carrier respectively even though the temperature changes.

In the conventional circuit, the phase noise performance drastically deteriorated, when the temperature is higher or lower than 27 degrees of centigrade that is the standard operation temperature.

In the first embodiment, the bias current Ibias changes so that the difference between the maximum value and the minimum value Vmax−Vmin of the oscillation output signal RFout traces the threshold voltage Vthn, though the threshold voltage Vthn changes by the fluctuation of the temperature.

In the conventional circuit, the bias current Ibias is adjusted so that the difference between the maximum value and the minimum value Vmax−Vmin of the oscillation output signal RFout is equal to the predetermined threshold voltage. Then the difference between the maximum value and the minimum value Vmax−Vmin of the oscillation output signal RFout is out of the range of the condition that gives the good phase noise performance by the variation in the circuit operation temperature.

Figure 5A:
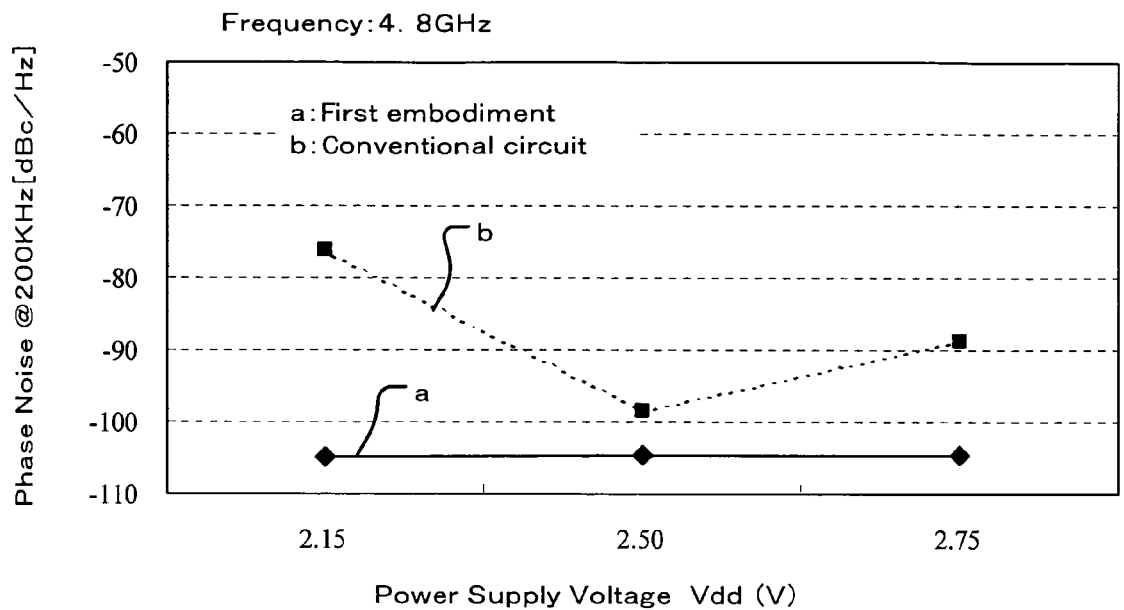
FIGS. 5A to 5B are plots showing a result of a simulation of the phase noise performance versus power supply voltage.
Figure 5B:
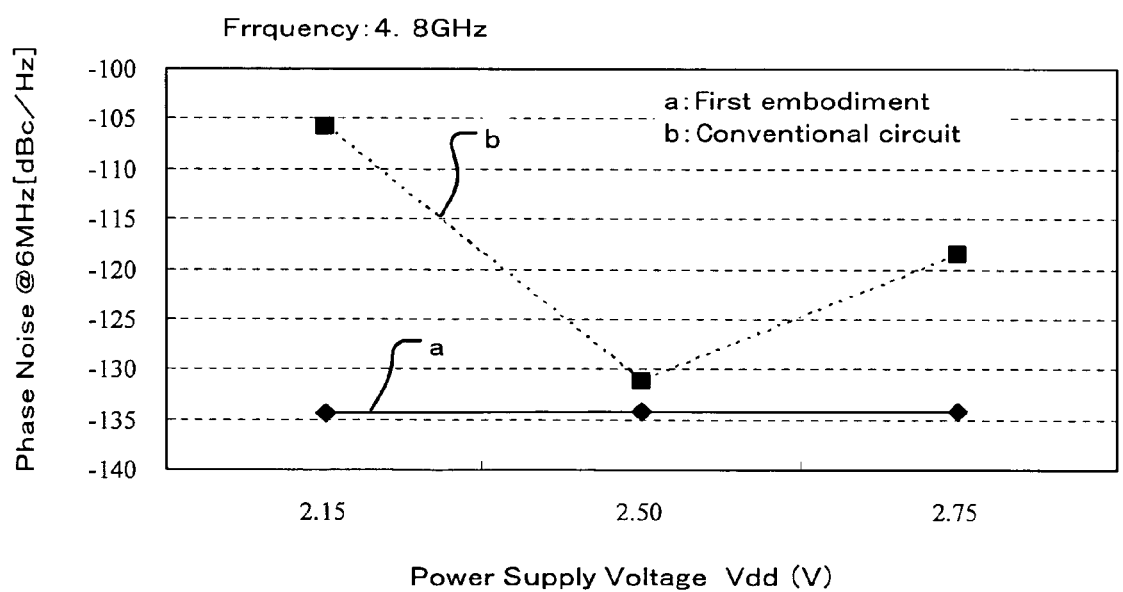

FIG. 5A shows a result of a simulation of the phase noise performance versus power supply voltage at 200 kHz offset from a 4.8 GHz carrier. FIG. 5B shows a result of a simulation of the phase noise performance versus power supply voltage at 6 MHz offset from a 4.8 GHz carrier.

In the first embodiment, the phase noise performances are constant approximately with −105 dBc/Hz at 200 kHz offset from a 4.8 GHz carrier and −135 dBc/Hz at 6 GHz offset from a 4.8 GHz carrier respectively even though the power supply voltage changes.

In the conventional circuit, the phase noise performance drastically deteriorated when the power supply voltage is higher or lower than 2.5V that is the standard power supply voltage.

In the first embodiment, the bias current Ibias changes so that the difference between the maximum value and minimum value Vmax−Vmin of the oscillation output signal RFout is kept constant even though the power supply voltage changes.

In the conventional circuit, the bias current Ibias is adjusted in accordance with the changes of the power supply voltage. Then the difference between the maximum value and minimum value Vmax−Vmin of the oscillation output signal RFout is out of the range of the condition that gives a good phase noise performance by the changes of the power supply voltage.

Finally, a sufficient phase noise performance is obtained even though the use environment and the fabrication process fluctuate.

Figure 6:
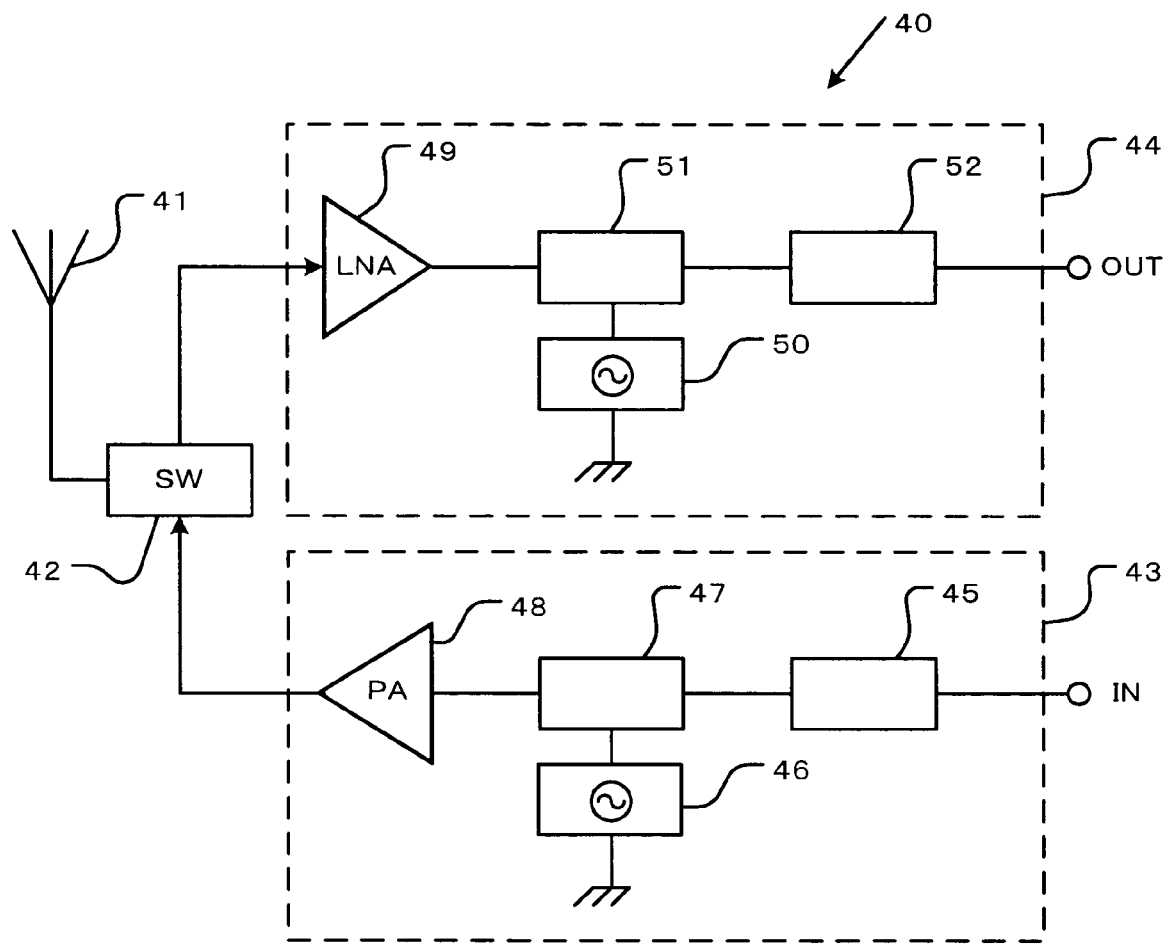
FIG. 6 shows a schematic block diagram of an example of a wireless communication device utilizing the semiconductor integrated circuit device according to the first embodiment of the present invention.

FIG. 6 shows a schematic block diagram of an example of a wireless communication device utilizing the semiconductor integrated device according to the first embodiment of the invention. The wireless communication device 40 is provided with a transmitter 43 and receiver 44.

The transmitter 43 includes a first semiconductor integrated circuit device 46 having a first voltage controlled oscillation circuit and a modulation circuit 47 to modulate the oscillation output signal RFout of the first voltage controlled oscillation circuit by an input signal.

The transmitter 43 further includes an input signal processing circuit 45 to process the input signal and power amplifier 48 to amplify the modulated oscillation output signal and to output to an antenna 41 via a switching circuit 42. The antenna 41 emits the modulated oscillation output signal.

The receiver 44 includes a low noise amplifier 49 to amplify the modulated oscillation output signal received by the antenna 41 and transmitted via the switching circuit 42, a second semiconductor integrated circuit device 50 having a second voltage controlled oscillation circuit and a demodulation circuit 51 to demodulate the modulated oscillation output signal by a oscillation output signal RFout of the second voltage controlled oscillation circuit.

The receiver 44 further includes a signal processing circuit 52 to process the demodulated oscillation output signal and to output the processed signal.

According to the wireless communication device 40, transmission of the input signal i.e. an audio signal and a picture signal and receipt of the input signal can be well performed without any trouble.

The semiconductor integrated circuit device in accordance with the above embodiment is capable of maintaining the difference between the maximum value and minimum value of oscillation output signal RFout to the threshold voltage of the MOSFET of the voltage controlled oscillation circuit 12, which gives a sufficient phase noise performance.

As a result, the oscillation output signal RFout with the sufficient phase noise performance may be stably obtained even if the use environment and the fabrication process cause the change of the threshold voltage Vthn of the MOSFET. Consequently, a small wireless communication device with high accuracy can be provided.

It is explained that the wireless communication device 40 includes both of the transmitter 43 and the receiver 44. But the communication device 40 may be provided with one of the transmitter 43 and the receiver 44.

Figure 7A:
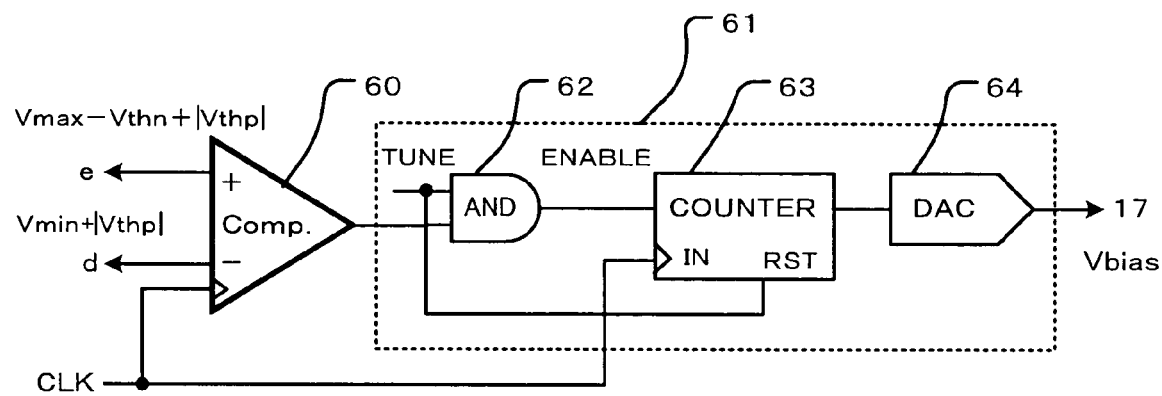
FIG. 7A shows a schematic circuitry of a main portion of a semiconductor integrated circuit device according to a second embodiment of the invention.
Figure 7B:
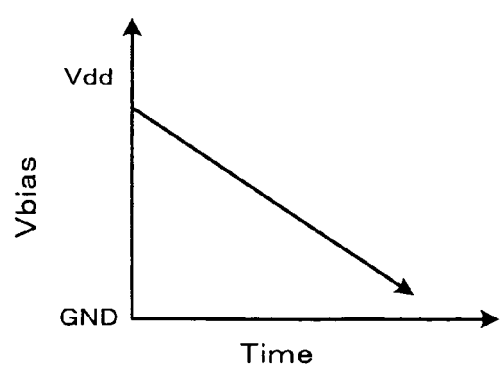
FIG. 7B is a plot showing an example of a bias voltage versus a sweep time.

A semiconductor integrated circuit device of a second embodiment according to the invention is hereinafter explained with reference to FIGS. 7A, 7B. FIG. 7A shows a schematic circuitry of a main portion of a semiconductor integrated circuit device according to the second embodiment of the invention. The differential amplifier 18 is replaced with the circuitry of FIG. 7A. FIG. 7B is a plot showing an example of a bias current Ibias versus a sweep time. With respect to each portion of the second embodiment in FIG. 2 is designated by the same reference numeral.

The second embodiment differs from the first embodiment in that the difference between the maximum value and the minimum value of the oscillation output signal RFout is substantially equal to the threshold voltage of the MOSFET by the sweep of the control voltage Vbias.

A comparison between the maximum voltage Vmax shifted by the first predetermined voltage Vref and the minimum voltage Vmin is carried out, and the bias current Ibias of the voltage controlled oscillation circuit 12 is regulated based on the result of the comparison.

In the second embodiment, it is possible that the phase noise performance is tuned because the difference between the maximum value and the minimum value of the oscillation output signal RFout is adjusted when the power supply voltage is initially provided or when it is needed.

As shown in FIG. 7A, the semiconductor integrated circuit device of the second embodiment is provided with a comparator 60 having two input terminals and output terminal, one of the input terminals is connected to the node e of the first reference voltage generation circuit 16, the other of the input terminals is connected to the node d of the minimum value detection circuit 14, a bias current sweep circuit 61 coupled between the comparator 60 and the bias current control circuit 17.

Synchronized with a clock signal CLK, the comparator 60 compares the voltage Vmax−Vthn+|Vthp| with the voltage Vmin+|Vthp|. The result of the comparison is provided to one of input terminals of a logical product circuit 62 (hereinafter, referred to as "AND circuit").

The bias current sweep circuit 61 is provided with the AND circuit 62 to take a logical product between an output of the comparator 60 and a tuning signal TUNE, a counter 63 to count the clock signal CLK when the result of the logical product is high level and a digital to analogue converter 64 (hereinafter, referred to as "D/A converter") to convert a count value of the counter 63 to an analogue sweep signal. The analogue sweep signal is provided to the gate G10 of the tenth MOSFET M10 of the bias current control circuit 17.

The counter 63 is reset when the tuning signal TUNE is provided. The tuning signal TUNE is provided when the power supply voltage Vdd is initially provided or when it is needed. Then, the counter 63 starts to count the clock signal CLK when an enable signal ENABLE is high level.

The D/A converter 64 converts the count value of the counter 63 to the analogue voltage. The analogue voltage is outputted to the bias current control circuit 17 as the control voltage Vbias.

As shown in FIG. 7B, the control voltage Vbias is swept lineally from the power supply voltage vdd to the ground. The bias current Ibias is swept in accordance with the control voltage Vbias. Consequently, the difference between the maximum value and the minimum value of the oscillation output signal RFout is increasing.

When the difference between the maximum value and the minimum value of the oscillation output signal RFout is larger than the threshold voltage of the N-type MOSFET, the output of the comparator 60 is inverted to low level and the enable signal ENABLE is low level. Then, the counter 63 stops to count the clock signal CLK.

Therefore, it is possible that the difference between the maximum value and the minimum value of the oscillation output signal RFout is substantially equal to the threshold voltage of the N-type MOSFET. It is because the control voltage Vbias is maintained at the count value when the counter 63 stopped the count of the clock signal CLK.

As a result, the differential amplifier 18 shown in FIG. 2 is replaced with the comparator 60 and the bias current sweep circuit 61. The semiconductor integrated circuit device of the second embodiment can be used as the first and second semiconductor integrated circuit devices 46, 50.

The semiconductor integrated circuit device in accordance with the second embodiment is capable of tuning the phase noise performance when it is needed. It is because the difference between the maximum value and the minimum value of the oscillation output signal RFout is substantially equal to the threshold voltage of the N-type MOSFET by the sweep of the control voltage Vbias.

Therefore, there is a merit that the semiconductor integrated circuit device of the second embodiment gives more flexibility to a design of a phase locked loop having the voltage controlled oscillation circuit. There is also a merit that the semiconductor integrated circuit device of the second embodiment suits a design of being incorporated into a semiconductor digital integrated circuit device.

Figure 8A:
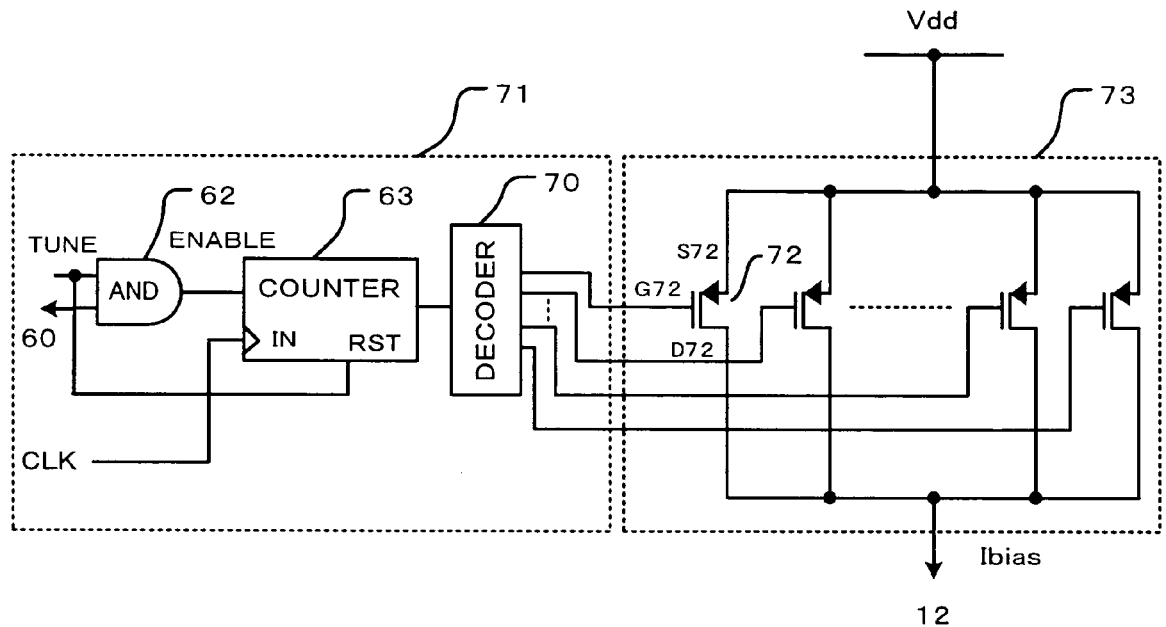
FIG. 8A shows a schematic circuitry of a main portion of a semiconductor integrated circuit device according to a third embodiment of the invention.
Figure 8B:
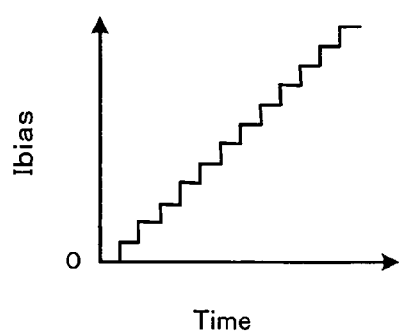
FIG. 8B is a plot showing an example of a bias current versus a sweep time.

A semiconductor integrated circuit device of a third embodiment according to the invention is hereinafter explained with reference to FIGS. 8A, 8B. FIG. 8A shows a schematic circuitry of a main portion of a semiconductor integrated circuit device according to the third embodiment of the invention. The differential amplifier 18 is replaced with the circuit of FIG. 8A. FIG. 8B is a plot showing an example of a bias current versus a sweep time. With respect to each portion of the third embodiment in FIG. 2 is designated by the same reference numeral.

The third embodiment differs from the first embodiment in that the bias current control circuit 17 is provided with a parallel-connected circuit of a plurality of switching transistors.

The bias current Ibias of the bias current control circuit 17 shown in FIG. 1 is regulated by digital control, instead of analogue control.

It is possible that the analogue circuit of the bias current control circuit 17 is replaced with the digital circuit which is more suitable for being incorporated into the semiconductor digital integrated circuit device.

As shown in FIG. 8A, the semiconductor integrated circuit device of the third embodiment is provided with a bias current sweep circuit 71 and a bias current control circuit 73. The bias current sweep circuit 71 includes the AND circuit 62, the counter 63 and a decoder 70 to decode the count value of the counter 63. The decoded signal is provided to the bias current control circuit 73.

The bias current control circuit 73 includes a plurality of the switching transistors 72. A plurality of gates G72 of the switching transistors 72 is connected to a plurality of the output terminals of the decoder 70 respectively. A plurality of sources S72 of the switching transistors 72 is connected to the power supply voltage Vdd. A plurality of drains D72 of the switching transistors 72 is connected to the voltage controlled oscillation circuit 12.

The counter 63 is reset when the tuning signal TUNE is provided. The tuning signal TUNE is provided when the power supply voltage Vdd is initially provided or when it is needed. Then, the counter 63 starts to count the clock signal CLK when an enable signal ENABLE is high level.

The decoder 70 decodes the count value of the counter 63 to a plurality of switching signals. The plurality of the switching signals is provided to a plurality of the gates G72 of the switching transistors 72 respectively. Then, a plurality of the switching transistors 72 is turned on in accordance with the plurality of the switching signals.

As shown in FIG. 8B, the bias current Ibias of the voltage controlled oscillation circuit 12 increases like the stairs. The difference between the maximum value and the minimum value of the oscillation output signal RFout also increases like the stairs.

When the difference between the maximum value and the minimum value of the oscillation output signal RFout is larger than the threshold voltage of the N-type MOSFET, the output of the comparator 60 is inverted to low level and the enable signal ENABLE is low level. Then, the counter 63 stops to count the clock signal CLK.

Therefore, it is possible that the difference between the maximum value and the minimum value of the oscillation output signal RFout is substantially equal to the threshold voltage of the N-type MOSFET. It is because the plurality of the switching transistors 72 is maintained to the turn-on condition when the counter 63 stopped the count of the clock signal CLK.

As a result, the bias current sweep circuit 61 shown in FIG. 7A is replaced with the bias current sweep circuit 71, and the bias current control circuit 17 shown in FIG. 2 is replaced with the bias current control circuit 73. The semiconductor integrated circuit device of the third embodiment can be used as the first and second semiconductor integrated circuit devices 46, 50.

In the semiconductor integrated circuit device in accordance with the third embodiment, the analogue bias current sweep circuit 71 is replaced with the digital bias current control circuit 73. Therefore it is further suitable for being incorporated into the semiconductor digital integrated circuit device.

Figure 9:
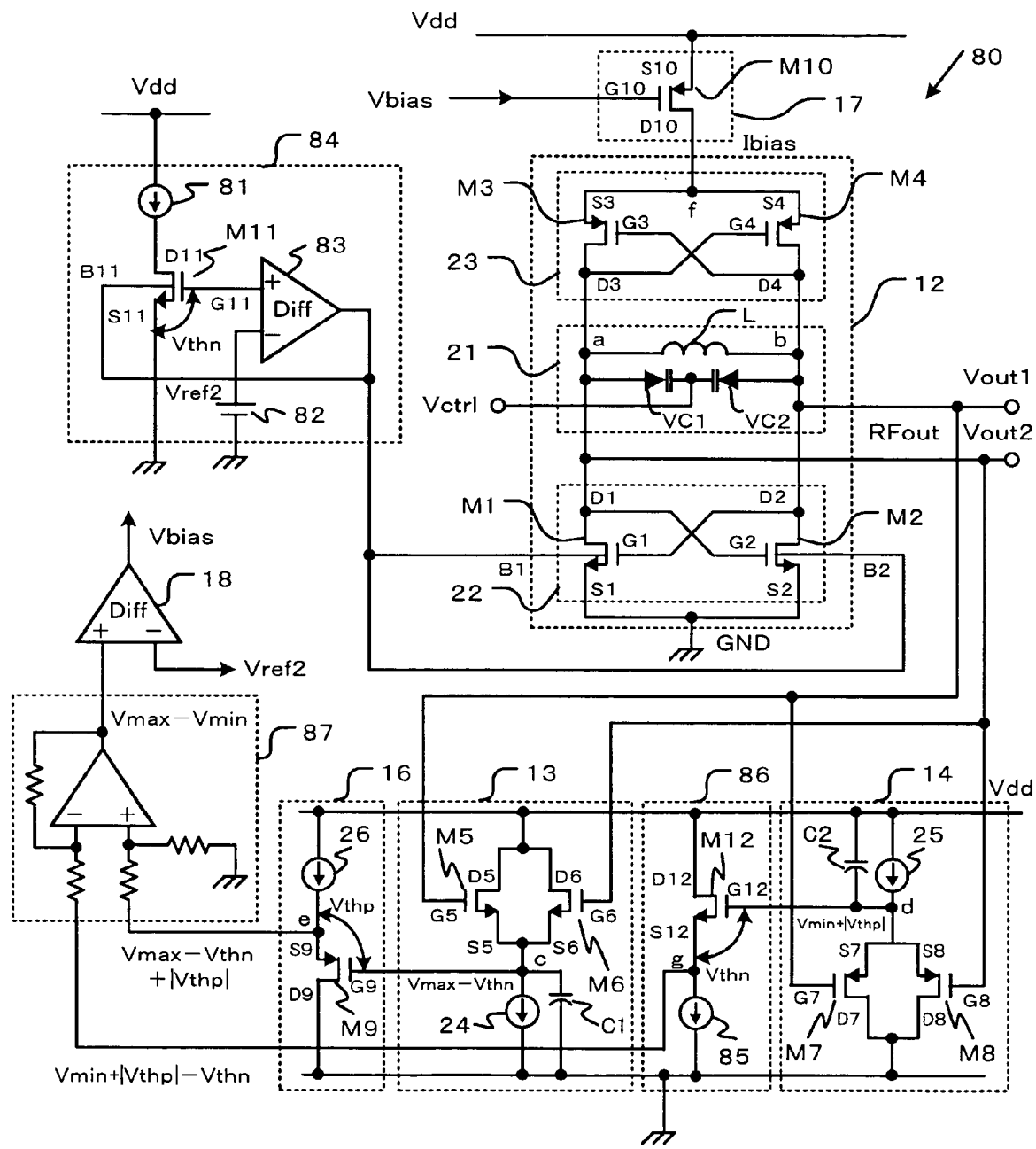
FIG. 9 shows a schematic circuitry of a semiconductor integrated circuit device according to a forth embodiment of the invention.

A semiconductor integrated circuit device of a fourth embodiment according to the invention is hereinafter explained with reference to FIG. 9. FIG. 9 shows a schematic circuitry of a semiconductor integrated circuit device according to a fourth embodiment of the invention. With respect to each portion of the fourth embodiment in FIG. 2 is designated by the same reference numeral.

The fourth embodiment differs from the first embodiment in that the phase noise performance of the oscillation output signal RFout and the difference between the maximum value and the minimum value of the oscillation output signal RFout are independently varied.

In the first embodiment, the difference between the maximum value and the minimum value of the oscillation output signal RFout is fixed to the threshold voltage Vthn of the N-type MOSFET that gives sufficient phase noise performance.

In the fourth embodiment, while maintaining the sufficient phase noise performance, the difference between the maximum value and the minimum value of the oscillation output signal RFout is varied by the change of the threshold voltage Vthn of the N-type MOSFET caused by a substrate bias effect.

The threshold voltage control circuit is added to the semiconductor integrated circuit device shown in FIG. 1. The threshold voltage control circuit changes the threshold voltage Vthn of the N-type MOSFET of the voltage controlled oscillation circuit 12.

Both the difference between the maximum value and the minimum value of the oscillation output signal RFout being substantially equal to the changed threshold voltage of the N-type MOSFET of the voltage controlled oscillation circuit 12 and the sufficient phase noise performance are obtained. The threshold voltage control circuit is also applied to the second and third embodiments.

As shown in FIG. 9, the semiconductor integrated circuit device 80 of the forth embodiment is provided with a threshold voltage control circuit 84, a third reference voltage generation circuit 86 and a subtraction circuit 87.

The threshold voltage control circuit 84 includes a eleventh N-type MOSFET M11 and a differential amplifier 83 having two input terminals and output terminal. A drain D11 of the eleventh MOSFET M11 is connected to the power supply voltage Vdd via a fourth constant current source 81, and a source S11 of the eleventh MOSFET M11 is connected to the ground.

One of the input terminals of the differential amplifier 83 is connected to a gate G11 of the eleventh MOSFET M11, the other of the input terminals of the differential amplifier 83 is connected to a second reference voltage generation circuit 82 to generate a second predetermined voltage Vref2, and the output terminal of the differential amplifier 83 is connected to a back-gate B11 of the eleventh MOSFET M11, and to back-gates B11, B12 of the first and second MOSFET M1, M2 of the first amplification circuit 22.

The third reference voltage generation circuit 86 includes a twelfth N-type MOSFET M12 which a source S12 of the twelfth MOSFET M12 is connected to the ground via a fifth constant current source 85, a drain D12 of the twelfth MOSFET M12 is connected to the power supply voltage Vdd, a gate G12 of the twelfth MOSFET M12 is connected to the node d of the minimum value detection circuit 14.

The subtraction circuit 87 has two input terminals and output terminal. One of the input terminals is connected to the node e of the first reference voltage generation circuit 16 and the other input terminals is connected to a node g of the third reference voltage generation circuit 86.

The threshold voltage of the eleventh MOSFET M11 is substantially equal to the threshold voltages of the first and second MOSFETs M1, M2.

A voltage between the gate G11 and the source S11 of the eleventh MOSFET M11 is substantially equal to the threshold voltage Vthn of the eleventh MOSFET M11. It is because the MOSFET M11 is driven at a starting current by the fourth constant current source 81.

The threshold voltage Vthn of the eleventh MOSFET M11 is substantially equal to the second predetermined voltage Vref2. It is because the voltage of the back-gate B11 is sifted so that the voltage of one of the input terminals of the differential amplifier 83 is substantially equal to the voltage of the other of the input terminals of the differential amplifier 83.

The threshold voltages Vthn of the first and second MOSFETs M1, M2 are substantially equal to the second predetermined voltage Vref2. It is because the back-gates B1, B2 of the first and second MOSFETs M1, M2 of the first amplification circuit 22 are connected to the output terminal of the differential amplifier 83.

One of the input terminals of the differential amplifier 18 is connected to the output terminal of the subtraction circuit 87. The difference between the maximum value and the minimum value of the oscillation output signal RFout is provided to one of the input terminals of the differential amplifier 18.

The other of the input terminals of the differential amplifier 18 is connected to the second reference voltage generation circuit 82. The second predetermined voltage Vref2 is provided to the other of the input terminals of the differential amplifier 18.

The difference between the maximum value and the minimum value of the oscillation output signal RFout is substantially equal to the second predetermined voltage Vref2. As a result, the difference between the maximum value and the minimum value of the oscillation output signal RFout is varied so as to be substantially equal to the threshold voltage of the N-type MOSFET by the differential amplifier 18.

Therefore, while maintaining the sufficient phase noise performance, it is possible that the difference between the maximum value and the minimum value of the oscillation output signal RFout is varied in accordance with the second predetermined voltage Vref2.

The semiconductor integrated circuit device 80 can be used as the first and second semiconductor integrated circuit devices 46, 50.

The semiconductor integrated circuit device 80 in accordance with the fourth embodiment has a merit that the difference between the maximum value and the minimum value of the oscillation output signal RFout can be adapted to an external circuit for some purpose while maintaining the sufficient phase noise performance.

In the first, second, third and fourth embodiments, it is explained that the difference between the maximum value and the minimum value of the oscillation output signal RFout is substantially equal to the threshold voltage Vthn of the N-type MOSFET. But the difference between the maximum value and the minimum value of the oscillation output signal RFout may be substantially equal to the threshold voltage |Vthp| of the P-type MOSFET.

Figure 10:
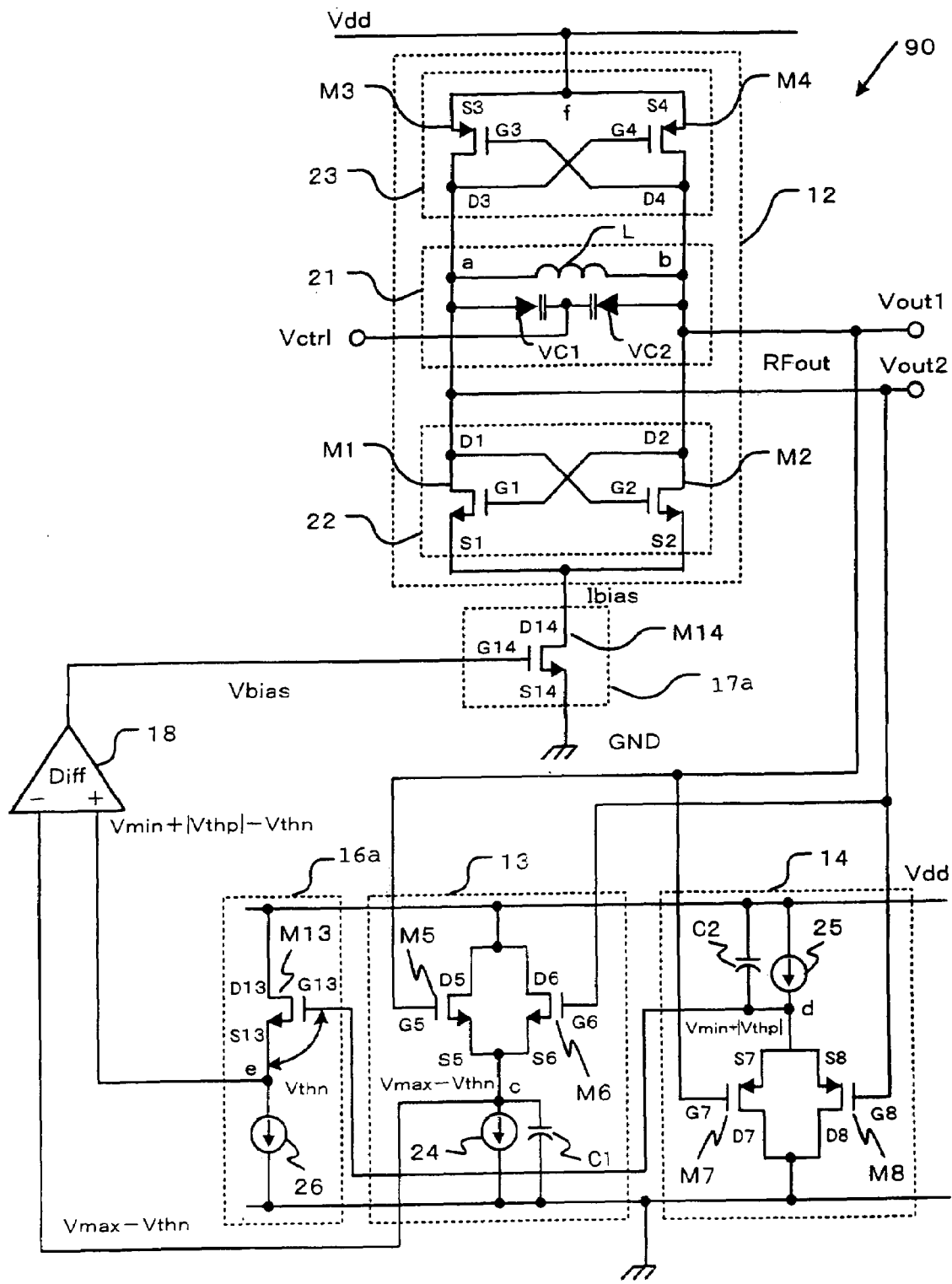
FIG. 10 shows a schematic circuitry of a semiconductor integrated circuit device according to another embodiment of the invention.

A semiconductor integrated circuit device of another embodiment according to the invention is hereinafter explained with reference to FIG. 10. FIG. 10 shows a schematic circuitry of a semiconductor integrated circuit device according to another embodiment of the invention. With respect to each portion of the fourth embodiment in FIG. 2 is designated by the same reference numeral.

As shown in FIG. 10, the ninth P-type MOSFET M9 of the first reference voltage generation circuit 16 is replaced with a thirteenth N-type MOSFET M13. The tenth P-type MOSFET M10 of the bias current control circuit 17 is replaced with a fourteenth N-type MOSFET M14. The bias current control circuit 17 is coupled between the voltage controlled oscillation circuit 12 and the ground.

Then, one of the input terminals of the differential amplifier 18 is connected to the node d of the first reference voltage generation circuit 16. The gate G13 of the thirteenth MOSFET M13 of the first reference voltage generation circuit 16 is connected to the node d of the minimum value detection circuit 14. The other of the input terminals of the differential amplifier 18 is connected to the node c of the maximum value detection circuit 13.

It is explained that the voltage controlled oscillation circuit 12 is provided with both the first amplification circuit 22 and the second amplification circuit 23. But the voltage controlled oscillation circuit 12 may be provided with one of the first amplification circuit 22 and the second amplification circuit 23.

Further, it is explained that the transistor is the MOSFET. But the transistor may be a bipolar transistor.

What is claimed is:

1. A semiconductor integrated circuit device, comprising:
  a voltage controlled oscillation circuit;
  a maximum value detection circuit having an N-type MOSFET to detect a first value corresponding to a maximum value of an oscillation output signal of the voltage controlled oscillation circuit;
  a minimum value detection circuit to detect a second value corresponding to a minimum value of the oscillation output signal of the voltage controlled oscillation circuit;
  a first reference voltage generation circuit to generate a first predetermined voltage, the first reference voltage generation circuit being arranged to receive the first value and to output a difference between the first value and the first predetermined voltage;
  a bias current control circuit to regulate a bias current of the voltage controlled oscillation circuit by a control signal, the bias current control circuit being connected in series to the voltage controlled oscillation circuit; and
  a differential amplifier to output a feedback signal to the bias current control circuit so that the difference between the maximum value and the minimum value of the oscillation output signal may be equal to the threshold voltage of the N-type MOSFET, wherein:
the voltage controlled oscillation circuit comprises a LC resonant circuit and an insulated gate field effect transistor to perform positive feedback: and
the first predetermined voltage is a value corresponding to a threshold voltage of the insulated gate field effect transistor of the voltage controlled oscillation circuit.

2. A semiconductor integrated circuit device according to claim 1, wherein the maximum value detection circuit comprises a differential amplification circuit having a first conductivity type insulated gate field effect transistor connected in series to a constant current source, and a capacitance connected in parallel to the constant current source and being arranged to generate the first value that is a difference between the maximum value of the oscillation output signal of the voltage controlled oscillation circuit and a threshold voltage of the first conductivity type insulated gate field effect transistor connected in series to the current source.

3. A semiconductor integrated circuit device according to claim 1, wherein the minimum value detection circuit comprises a differential amplification circuit having a second conductivity type insulated gate field effect transistor connected in series to a constant current source, and a capacitance connected in parallel to the constant current source, and being arranged to generate the second value that is a sum of the minimum value of the oscillation output signal of the voltage controlled oscillation circuit and an absolute value of the threshold voltage of the second conductivity type insulated gate field effect transistor connected in series to the constant current source.

4. A semiconductor integrated circuit device according to claim 1, wherein the first reference voltage generation circuit comprises a second conductivity type insulated gate field effect transistor connected in series to a constant current source.

5. A semiconductor integrated circuit device according to claim 1, wherein the threshold voltage of the insulated gate field effect transistor of the voltage controlled oscillation circuit is equal to the threshold voltage of the N-type MOSFET of the maximum value detection circuit.

6. A semiconductor integrated circuit device according to claim 1, wherein the threshold voltage of a second conductivity type insulated gate field effect transistor included in the minimum value detection circuit is equal to the threshold voltage of a second conductivity type insulated gate field effect transistor included in the first reference voltage generation circuit.

7. A semiconductor integrated circuit device according to claim 1, further comprising:
a constant current source;
a first conductivity type insulated gate field effect transistor connected in series to the constant current source;
a second differential amplifier having two input terminals and output terminal, one of the input terminals being connected to a gate of the first conductivity type insulated gate field effect transistor, the other of the input terminals being connected to a second reference voltage generation circuit to generate a second predetermined voltage, and the output terminal being connected to at least one of a substrate and a source of the first conductivity type insulated gate field effect transistor and at least one of a substrate and a source of the insulated gate field effect transistor of the voltage controlled oscillation circuit.

8. A semiconductor integrated circuit device according to claim 7, wherein the difference between the maximum value and the minimum value of the oscillation output signal may be equal to the second predetermined voltage.

9. A semiconductor integrated circuit device, comprising:
a voltage controlled oscillation circuit;
a maximum value detection circuit to detect a first value corresponding to a maximum value of an oscillation output signal of the voltage controlled oscillation circuit;
a minimum value detection circuit having a P-type MOSFET to detect a second value corresponding to a minimum value of the oscillation output signal of the voltage controlled oscillation circuit;
a first reference voltage generation circuit to generate a first predetermined voltage, the first reference voltage generation circuit being arranged to receive the second value and to output a difference between the second value and the first predetermined voltage;
a bias current control circuit to regulate a bias current of the voltage controlled oscillation circuit by a control signal, the bias current control circuit being connected in series to the voltage controlled oscillation circuit; and
a differential amplifier to output a feedback signal to the bias current control circuit so that the difference between the maximum value and the minimum value of the oscillation output signal may be equal to the threshold voltage of the P-type MOSFET,
wherein:
the voltage controlled oscillation circuit comprises a LC resonant circuit and an insulated gate field effect transistor to perform positive feedback; and
the first predetermined voltage is a value corresponding to a threshold voltage of the insulated gate field effect transistor of the voltage controlled oscillation circuit.

10. A semiconductor integrated circuit device according to claim 9, wherein the maximum value detection circuit comprises a differential amplification circuit having a first conductivity type insulated gate field effect transistor connected in series to a constant current source, and a capacitance connected in parallel to the constant current source and being arranged to generate the first value that is a difference between the maximum value of the oscillation output signal of the voltage controlled oscillation circuit and a threshold voltage of the first conductivity type insulated gate field effect transistor connected in series to the current source.

11. A semiconductor integrated circuit device according to claim 9, wherein the minimum value detection circuit comprises a differential amplification circuit having a second conductivity type insulated gate field effect transistor connected in series to a constant current source, and a capacitance connected in parallel to the constant current source, and being arranged to generate the second value that is a sum of the minimum value of the oscillation output signal of the voltage controlled oscillation circuit and an absolute value of the threshold voltage of the second conductivity type insulated gate field effect transistor connected in series to the constant current source.

12. A semiconductor integrated circuit device according to claim 9, wherein the first reference voltage generation circuit comprises a second conductivity type insulated gate field effect transistor connected in series to a constant current source.

13. A semiconductor integrated circuit device according to claim 9, wherein the threshold voltage of the insulated gate field effect transistor of the voltage controlled oscillation circuit is equal to the threshold voltage of a first conductivity type insulated gate field effect transistor included in the maximum value detection circuit.

14. A semiconductor integrated circuit device according to claim 9, wherein the threshold voltage of the P-type MOSFET of the minimum value detection circuit is equal to the threshold voltage of a second conductivity type insulated gate field effect transistor included in the first reference voltage generation circuit.

15. A semiconductor integrated circuit device according to claim 9, further comprising:
   a constant current source;
   a first conductivity type insulated gate field effect transistor connected in series to the constant current source;
   a second differential amplifier having two input terminals and output terminal, one of the input terminals being connected to a gate of the first conductivity type insulated gate field effect transistor, the other of the input terminals being connected to a second reference voltage generation circuit to generate a second predetermined voltage, and the output terminal being connected to at least one of a substrate and a source of the first conductivity type insulated gate field effect transistor and at least one of a substrate and a source of the insulated gate field effect transistor of the voltage controlled oscillation circuit.

16. A semiconductor integrated circuit device according to claim 15, wherein the difference between the maximum value and the minimum value of the oscillation output signal may be equal to the second predetermined voltage.

17. A semiconductor integrated circuit device, comprising:
   a voltage controlled oscillation circuit;
   a maximum value detection circuit having a N-type MOSFET to detect a first value corresponding to a maximum value of an oscillation output signal of the voltage controlled oscillation circuit;
   a minimum value detection circuit to detect a second value corresponding to a minimum value of the oscillation output signal of the voltage controlled oscillation circuit;
   a first reference voltage generation circuit to generate a first predetermined voltage, the first reference voltage generation circuit being arranged to receive the first value and to output a difference between the first value and the first predetermined voltage;
   a bias current control circuit to regulate a bias current of the voltage controlled oscillation circuit by a control signal, the bias current control circuit being connected in series to the voltage controlled oscillation circuit; and
   a comparator to compare the difference between maximum value and the minimum value of the oscillation output signal with the first predetermined voltage and to output a result of the comparison;
   a bias current sweep circuit to sweep the bias current on the result of the comparison of the comparator so that the difference between the maximum value and the minimum value of the oscillation output signal may be equal to the threshold voltage of the N-type MOSFET, wherein:
   the voltage controlled oscillation circuit comprises a LC resonant circuit and an insulated gate field effect transistor to perform positive feedback; and
   the first predetermined voltage is a value corresponding to a threshold voltage of the insulated gate field effect transistor of the voltage controlled oscillation circuit.

18. A semiconductor integrated circuit device according to claim 17, wherein the bias current control circuit comprises an insulated gate field effect transistor.

19. A semiconductor integrated circuit device according to claim 17, wherein the bias current sweep circuit is arranged to output an analogue sweep signal to the bias current control circuit, the analogue sweep signal being proportional to a sweep time.

20. A semiconductor integrated circuit device according to claim 17, wherein the bias current control circuit comprises a parallel-connected circuit of a plurality of switching transistors.

21. A semiconductor integrated circuit device according to claim 17, wherein the bias current sweep circuit is arranged to output a plurality of switching signals to the bias current control circuit, the switching signals being proportional to the sweep time.

22. A semiconductor integrated circuit device according to claim 17, further comprising:
   a constant current source;
   a first conductivity type insulated gate field effect transistor connected in series to the constant current source;
   a differential amplifier having two input terminals and output terminal, one of the input terminals being connected to a gate of the first conductivity type insulated gate field effect transistor, the other of the input terminals being connected to a second reference voltage generation circuit to generate a second predetermined voltage, and the output terminal being connected to at least one of a substrate and a source of the first conductivity type insulated gate field effect transistor and at least one of a substrate and a source of the insulated gate field effect transistor of the voltage controlled oscillation circuit.

23. A semiconductor integrated circuit device according to claim 22, wherein the difference between the maximum value and the minimum value of the oscillation output signal is equal to the second predetermined voltage.

24. A semiconductor integrated circuit device, comprising:
   a voltage controlled oscillation circuit;
   a maximum value detection circuit to detect a first value corresponding to a maximum value of an oscillation output signal of the voltage controlled oscillation circuit;
   a minimum value detection circuit having a P-type MOSFET to detect a second value corresponding to a minimum value of the oscillation output signal of the voltage controlled oscillation circuit;
   a first reference voltage generation circuit to generate a first predetermined voltage, the first reference voltage generation circuit being arranged to receive the second value and to output a difference between the second value and the first predetermined voltage;
   a bias current control circuit to regulate a bias current of the voltage controlled oscillation circuit by a control signal, the bias current control circuit being connected in series to the voltage controlled oscillation circuit; and
   a comparator to compare the difference between maximum value and the minimum value of the oscillation output signal with the first predetermined voltage and to output a result of the comparison; and
   a bias current sweep circuit to sweep the bias current on the result of the comparison of the comparator so that the difference between the maximum value and the minimum value of the oscillation output signal may be equal to the threshold voltage of the P-type MOSFET, the voltage controlled oscillation circuit comprises a LC resonant circuit and an insulated gate field effect transistor to perform positive feedback; and the first predetermined voltage is a value corresponding to a threshold voltage of the insulated gate field effect transistor of the voltage controlled oscillation circuit.

25. A semiconductor integrated circuit device according to claim 24, wherein the bias current control circuit comprises an insulated gate field effect transistor.

26. A semiconductor integrated circuit device according to claim 24, wherein the bias current sweep circuit is arranged to output an analogue sweep signal to the bias current control circuit, the analogue sweep signal being proportional to a sweep time.

27. A semiconductor integrated circuit device according to claim 24, wherein the bias current control circuit comprises a parallel-connected circuit of a plurality of switching transistors.

28. A semiconductor integrated circuit device according to claim 24, wherein the bias current sweep circuit is arranged to output a plurality of switching signals to the bias current control circuit, the switching signals being proportional to the sweep time.

29. A semiconductor integrated circuit device according to claim 24, further comprising:
a constant current source;
a first conductivity type insulated gate field effect transistor connected in series to the constant current source;
a differential amplifier having two input terminals and output terminal, one of the input terminals being connected to a gate of the first conductivity type insulated gate field effect transistor, the other of the input terminals being connected to a second reference voltage generation circuit to generate a second predetermined voltage, and the output terminal being connected to at least one of a substrate and a source of the first conductivity type insulated gate field effect transistor and at least one of a substrate and a source of the insulated gate field effect transistor of the voltage controlled oscillation circuit.

30. A semiconductor integrated circuit device according to claim 29, wherein the difference between the maximum value and the minimum value of the oscillation output signal is equal to the second predetermined voltage.

31. A wireless communication device, comprising:
at least one of a transmitter and a receiver;
the transmitter having:
(a) a first semiconductor integrated circuit device including a first voltage controlled oscillation circuit, a first maximum value detection circuit to detect a first maximum value of a first oscillation output signal of the first voltage controlled oscillation circuit, a first minimum value detection circuit to detect a first minimum value of the first oscillation output signal of the first voltage controlled oscillation circuit, a first reference voltage generation circuit to output a first predetermined voltage, a first bias current control circuit to regulate a first bias current of the first voltage controlled oscillation circuit by a first control signal, the first bias current control circuit being connected in series to the first voltage controlled oscillation circuit, a first comparator to compare the difference between the first maximum value and the first minimum value of the first oscillation output signal with the first predetermined voltage and to output a first result of the comparison, and a first bias current sweep circuit to sweep the first bias current based on the first result of the comparison of the first comparator so that the difference between the first maximum value and the first minimum value of the first oscillation output signal may be substantially equal to the first predetermined voltage;
(b) a modulation circuit to modulate the first oscillation output signal of the first voltage controlled oscillation circuit of the first semiconductor integrated circuit device by an input signal; and
(c) an antenna to emit the modulated first oscillation output signal, the receiver having:
(d) a second semiconductor integrated circuit device including a second voltage controlled oscillation circuit, a second maximum value detection circuit to detect a second maximum value of a second oscillation output signal of the second voltage controlled oscillation circuit, a second minimum value detection circuit to detect a second minimum value of the second oscillation output signal of the second voltage controlled oscillation circuit, a second reference voltage generation circuit to output a second predetermined voltage, a second bias current control circuit to regulate a second bias current of the second voltage controlled oscillation circuit by a second control signal, the second bias current control circuit being connected in series to the second voltage controlled oscillation circuit, a second comparator to compare the difference between the second maximum value and the second minimum value of the second oscillation output signal with the second predetermined voltage to output a second result of the comparison, a second bias current sweep circuit to sweep the second bias current based on the second result of the comparison of the second comparator so that the difference between the second maximum value and the second minimum value of the second oscillation output signal may be substantially equal to the second predetermined voltage;
(e) an antenna to receive the first modulated oscillation output signal; and
(f) a demodulation circuit to demodulate the modulated first oscillation output signal by the second oscillation output signal of the second voltage controlled oscillation circuit of the second semiconductor integrated circuit device.

* * * * *